(12) United States Patent
Tatsuno et al.

(10) Patent No.: US 6,597,712 B2
(45) Date of Patent: Jul. 22, 2003

(54) LASER DIODE MODULE

(75) Inventors: Kimio Tatsuno, Tokyo (JP); Hiroaki Furuichi, Yokohama (JP); Kazumi Kawamoto, Yokohama (JP); Katsumi Kuroguchi, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/934,562

(22) Filed: Aug. 23, 2001

(65) Prior Publication Data

US 2003/0039276 A1 Feb. 27, 2003

(30) Foreign Application Priority Data

Feb. 26, 2001 (JP) ........................................ 2001-050534

(51) Int. Cl.[7] ................................................ H01S 3/13
(52) U.S. Cl. ...................................... 372/32; 372/29.02
(58) Field of Search ................................ 372/26, 27, 28, 372/29.011, 38.01

(56) References Cited

U.S. PATENT DOCUMENTS

| 5,107,512 | A | * | 4/1992 | Shibutani ..................... 372/32 |
| 5,181,080 | A | * | 1/1993 | Fanton et al. ................ 356/632 |
| 5,790,242 | A | * | 8/1998 | Stern et al. .................. 356/4.04 |
| 5,880,838 | A | * | 3/1999 | Marx et al. ................... 356/498 |
| 5,929,442 | A | * | 7/1999 | Higashi .................. 250/339.13 |
| 5,949,562 | A | * | 9/1999 | Kubota et al. ............... 359/124 |
| 6,134,253 | A | * | 10/2000 | Munks et al. ................... 372/38 |
| 6,256,271 | B1 | * | 7/2001 | McLeod ................... 369/44.23 |
| 6,285,288 | B1 | * | 9/2001 | Langdon et al. ............. 340/603 |
| 6,289,028 | B1 | * | 9/2001 | Munks et al. ................... 372/20 |
| 6,373,867 | B1 | * | 4/2002 | Lin et al. ....................... 372/18 |

FOREIGN PATENT DOCUMENTS

JP            10-79723        3/1998    ............ H04J/14/00

OTHER PUBLICATIONS

Patent Abstracts of Japan 10–079723 Mar. 24, 1998.

* cited by examiner

*Primary Examiner*—Paul Ip
*Assistant Examiner*—Phillip Nguyen
(74) *Attorney, Agent, or Firm*—Antonelli, Terry, Stout & Kraus, LLP

(57) ABSTRACT

In a wavelength locking optical system, a resonator is formed between a wavelength deviation detection device and a facet of the laser diode, which makes a control signal unstable. A solution to this problem is to arrange polarization controlling elements between a wavelength deviation detection filter and a laser diode to stabilize the deviation signal, and to perform wavelength-locking with the stabilizer signal.

10 Claims, 9 Drawing Sheets

LASER DIODE MODULE

BACKGROUND OF THE INVENTION

The present invention relates to an optical communication module that is applied to a wavelength division multiplexing optical communication system. That is, the invention provides a stable optical system for locking a lasing wavelength of light from a laser source and a control system for the optical system. This optical system can be separately operated as a wavelength locker module, but it also can be integrated into an optical communication module having a laser source.

Optical fiber communication features a long transmission length, high speed and large capacity, and a strong immunity to electromagnetic noises; and, hence, a communication system that assures high reliability can be provided. Formerly, in such systems, light of a single wavelength was transmitted on a single strand of optical fiber. However, with the advent of large capacity computerization in recent years, there has been a strong demand for the transmission capacity to be further increased. Therefore, a wavelength division multiplexing optical communication system has been developed and put into practical use, in which a plurality of optical signals each having a different wavelength are transmitted over a single strand of optical fiber, so that the number of communication channels is increased to achieve a system having a larger capacity. Normally, for the wavelength of light to be transmitted in an optical fiber, use is made of wavelength bands where the transmission loss of the optical fiber is low, and such wavelength bands in a 1.3 $\mu$m range and in a 1.5 $\mu$m range are called windows of transmission. Since the wavelength widths of these windows are limited, the narrower the wavelength spacing between adjacent channels becomes, the more the number of transmission channels can be increased. Presently, the frequency spacing is set to 200 GHz and 100 GHz, but there is a trend toward further narrowing of the frequency spacing, such as to 50 GHz and 25 GHz. Converting the above-mentioned frequency spacings into wavelength spacings, those values become as narrow as approximately 1.6 nm, 0.8 nm, 0.4 nm, and 0.2 nm. When the wavelength spacing is narrowed to such levels, it becomes necessary for the wavelength of the laser source to be controlled to a constant value with pinpoint accuracy. This is because, if the wavelength of the laser source fluctuates to reach as far as the wavelength of the adjacent channel, there occurs crosstalk with the adjacent wavelength channel at the reception side, and, hence, the reliability of information transmission can not be assured. These wavelength (or, frequency) channels are called ITU-T (INTERNATIONAL TELECOMMUNICATION UNION-TELECOMMUNICATION STANDARDIZATION SECTOR) grids and are acknowledged widely as an ITU recommendation.

On the basis of the aforementioned considerations, there have been proposed several methods for controlling the wavelengths of the laser sources for the wavelength division multiplexing of optical communication systems. For example, a method has been devised for locking the wavelength of the laser diode by introducing a dielectric multi-layer filter, a Fabry-Perot etalon, or the like as a wavelength filter and using feedback to control the wavelength on the basis of the operating temperature of the laser diode. Among these wavelength filters, especially the etalon has characteristics such that transmission peaks appear repeatedly in the wavelength according to the number of orders of multi-interference, and therefore, by adjusting the periods of the transmission curve to the ITU-T grids, a single wavelength filter can be used to lock a plurality of wavelength channels. For example, JP-A-79723/1998 discloses a method of locking the wavelength by dividing light which has passed through the etalon into two portions, detecting the two portions using respective photo detectors, and subtracting one signal from the other signal to derive a wavelength deviation signal, which will be used to lock the wavelength.

SUMMARY OF THE INVENTION

It is a first object of the present invention to stabilize the wavelength of a laser diode. More specifically, it is an object of the invention to achieve stabilization of a wavelength locking system utilized in a semiconductor laser module (hereinafter referred to as a "laser diode module") in which the wavelength locking optical system is incorporated.

Among the transmitted light beams of the etalon utilized by the wavelength locking system, any light beams that contribute to the wavelength deviation detection effectively are almost collimated light beams. Accordingly, light reflected from the etalon goes back to the laser diode via a converging lens, is reflected by a facet thereof, and is reflected again by the etalon, which is repeated to cause multiple reflections. Therefore, the reflected waves multiply-interfere with one another; and, consequently, a distribution of the interference fringes varies in response to variation of the wavelength. Thus, light that arrives at a photo detector fluctuates, thereby to generate a ripple in the output, and so there arises a problem of instability in this wavelength deviation signal.

It is a second object of the present invention to eliminate or alleviate the external feedback noise in a laser diode. That is, in the operation of a laser diode, there is the problem that so-called external feedback noise (returned light noise) is generated, namely a fluctuation in the lasing intensity resulting from contention of the lasing mode of the laser diode itself with an external resonance mode that is generated by light returned to the laser diode being coupled to a waveguide thereof.

A basic form of the present invention consists of a laser diode module that comprises at least a laser diode device; a first detector element for receiving, directly or indirectly, a first light beam that is obtained when at least one of the light emissions of said laser diode device is divided into two light portions, each traveling in a different direction; a second detector element for receiving a second light beam that comprises the other of the divided light beams at least via a wavelength selective member; and means for controlling the lasing wavelength of the above-mentioned laser diode device on the basis of outputs of the above-mentioned first and second-photo detector elements, wherein a gap between the above-mentioned laser diode device and the above-mentioned wavelength selective member is formed so as to constitute an optical resonator with multi-interference eliminated or alleviated therein.

The following description provides typical examples of the construction of an optical cavity in which multi-interference between the above-mentioned laser diode device and the above-mentioned wavelength selective member is eliminated. The first scheme involves a technique in which the polarization directions of the light emitted from the light source and of light returning to the light source, as returned light, are made different from each other. A more concrete example is as follows. The above-mentioned wavelength selective member in an optical path between the laser diode and the above-mentioned wavelength selective member itself is arranged so as to generate reflected light having a degree of polarization different from that of the incident light falling on the wavelength selective member. In the most preferable form, this difference between the directions of polarization is such that the directions of polarization are mutually orthogonal, which can ensure the most stable operation.

The second scheme involves reduction of the mutual superposition of a light beam emitted from the light source and a light beam that returns to the light source as returned light. For example, the angle of the reflection surface is tilted to avoid a superposition of the incident light and the reflected light. A straightforward configuration for this scheme is as follows. When the incident light is vertical to the surface, the surface is tilted with the respect to the optical axis of the incident light.

DESCRIPTION OF THE PREFERRED EMBODIMENTS

As can be understood from the foregoing description, in order to reduce multi-interference in the resonator that is formed between the facet of the laser diode and a wavelength deviation detection filter, a representative embodiment of the present invention adopts a configuration wherein the facet of the laser diode and a wavelength deviation detection filter are arranged so as not to be parallel with each other, or wherein, by arranging a wave plate inside the resonator, the polarization states of the light beams are controlled so as to reduce superposition of the light beams having the same polarization; and, the arrangement further includes means for preventing multiple reflection by use of a polarizing element. Hereafter, several forms by which the objects of the present invention can be carried out in practice will be described as examples.

Figure 1:
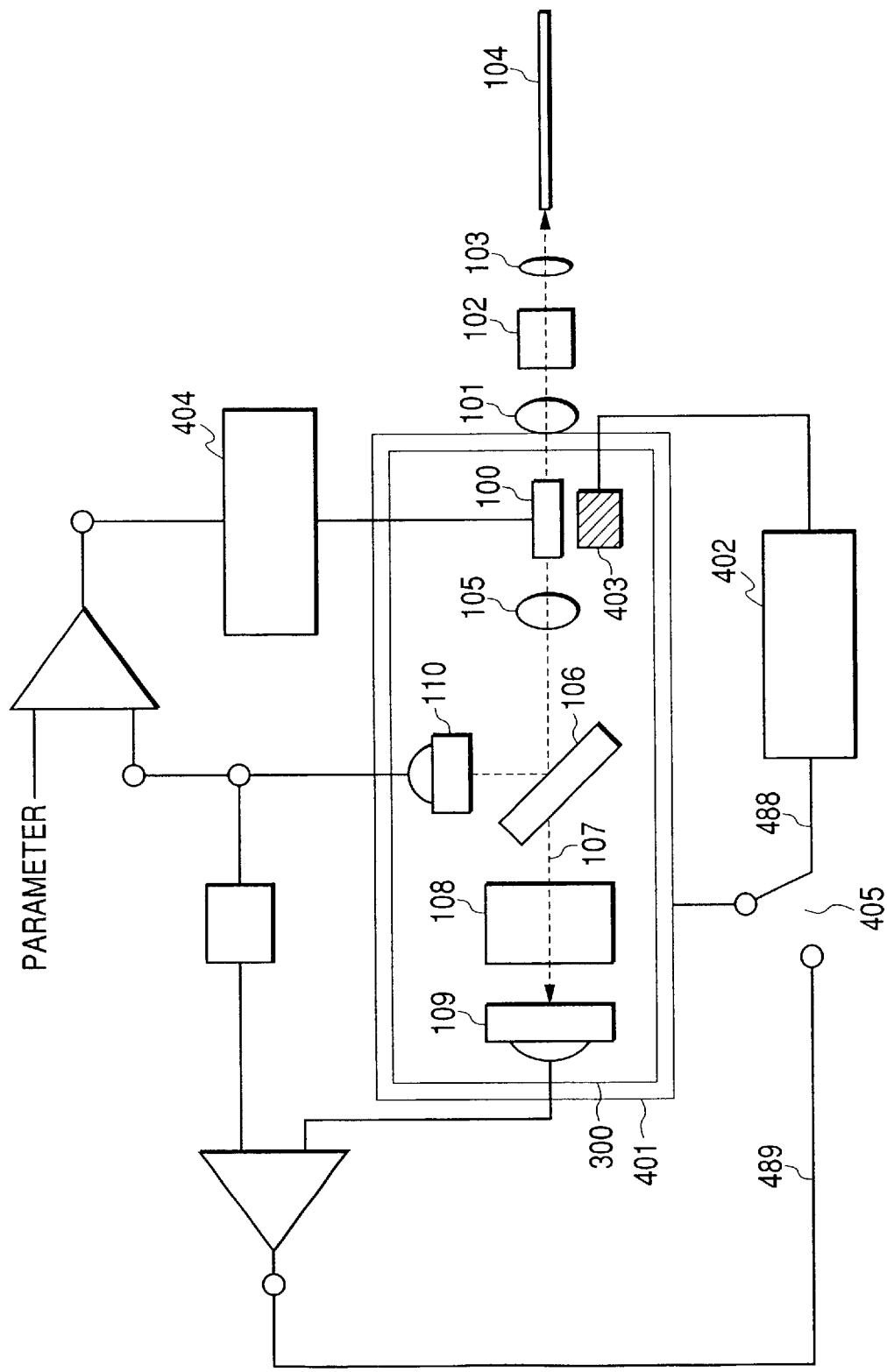
FIG. 1 is a block diagram of a wavelength control loop.

FIG. 1 shows an example of a control loop that acts to carry out wavelength locking according to the present invention. That is, the laser source 100 is a tunable laser diode device, for example, a DFB (distributed feed back) type or Fabry-Perot type laser diode device. Alternatively, the laser source 100 is a light source in which a DFB type laser diode device and an electro-absorbing modulator are integrated. Alternatively, the laser source 100 is a light source in which a laser diode device, equipped with a temperature control mechanism for tuning the wavelength, and an electro-absorbing modulator are integrated. That is, the tunable laser source 100, a collimator lens 105, a beam splitter 106, a photo detector 110, an etalon 108, a photo detector 109, a thermistor 403, etc. are mounted on a thermoelectric cooling device 401 placed below a stem 300, and the temperature of the laser 100 can be kept at a temperature in accordance with the resistance value of the thermistor 403 by a driving circuit 402 of the thermoelectric cooling device 401. on the other hand, forward emitting light of the tunable laser source 100 is collimated by a collimator 101 and coupled to an optical fiber 104 via an optical isolator 102 and a converging lens 103 to travel therein for information transmission.

Figure 2:
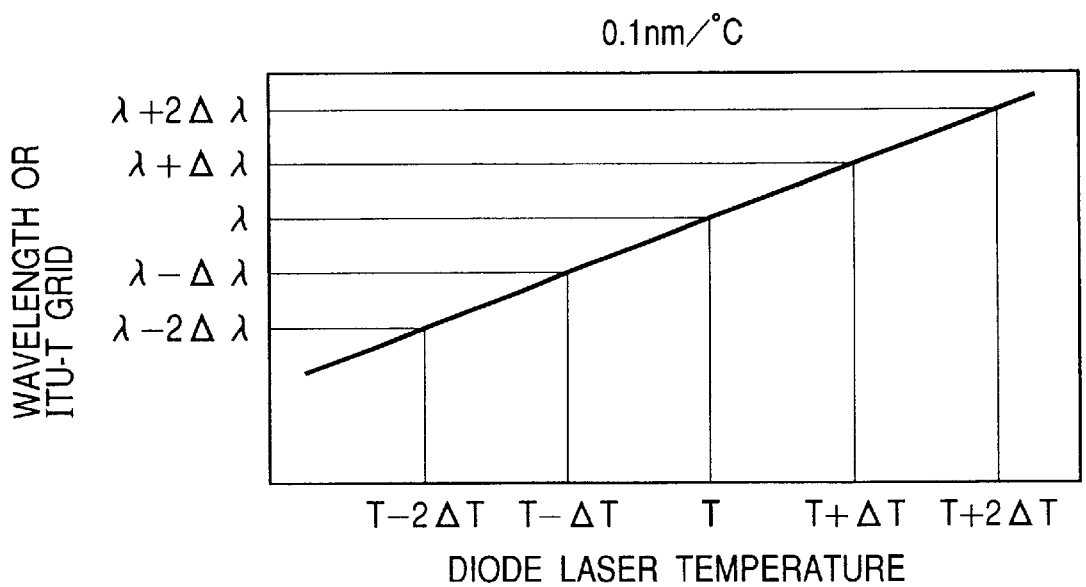
FIG. 2 is a graph showing an example of a relation between the lasing wavelength of a tunable laser diode and the temperature.

This wavelength controlling loop has a structure in which, by switching a temperature control loop 488 that has been closed by a switch 405 to a wavelength control loop 489, the wavelength control loop is selected. First, backward emitting light from the tunable laser source 100 is collimated by the collimator 105 and divided into transmitted light 107 and reflection light by the beam splitter 106 (a device for dividing light into two portions and guiding the two portions to different optical paths). The beam splitter 106 is of a shape formed by gluing two triangular prisms, or comprises a thin parallel planar plate with a dielectric thin film deposited thereon, if a non-glued structure is favored. The reflected light undergoes photoelectric conversion to become an output monitor signal of the laser source 100, which is compared with a previously-set value of the optical output and is fed back to a driving circuit 404 to keep the output value of the laser source constant. Further, the optical system operates to detect wavelength deviation according to the present, invention as follows. Since, in the tunable laser source 100, the lasing wavelength t varies as the temperature T changes, as shown in FIG. 2, the lasing wavelength corresponding to the ITU-T grid can be selected in accordance with the operating temperature. In FIG. 2, the horizontal axis denotes the temperature of the laser diode and the vertical axis denotes the lasing wavelength. It is a general application that the lasing wavelengths of the laser diode correspond to the wavelengths which are defined by the ITU-T grids. This matter will be described later. Incidentally, in the example of FIG. 2, the variation of the wavelength as a function of the temperature is 0.1 nm/° C. In this control loop of FIG. 1, the forward emitting light of the tunable laser source 100 is collimated by the collimator 101, passes though the optical isolator 102 and a converging lens 103, and is coupled to the optical fiber 104. Thus, information is transmitted on the light.

The configuration of an optical system for wavelength locking is as follows. That is, backward emitting light of the tunable laser source 100 is collimated by the collimator 105 and is divided into transmitted light 107 and reflected light by the beam splitter 106. For the beam splitter 106, there is a geometry in which triangular prisms are glued together or a thin parallel planar plate with a dielectric thin film deposited thereon is used. If a non-glued structure is favored, the latter is useful. The transmitted light 107 further travels to the etalon 108, and inside the etalon 108, light waves generated by multiple reflections interfere with one another to create transmission peaks expressed by the following equation (1).

$$It = 1/(1 + F \sin^2(\psi)), \qquad (1)$$

where $$F = 4R/(1-R)2 \qquad (2)$$

$$\psi = (2\pi nt/\lambda)\cos\theta' \qquad (3)$$

Figure 3:
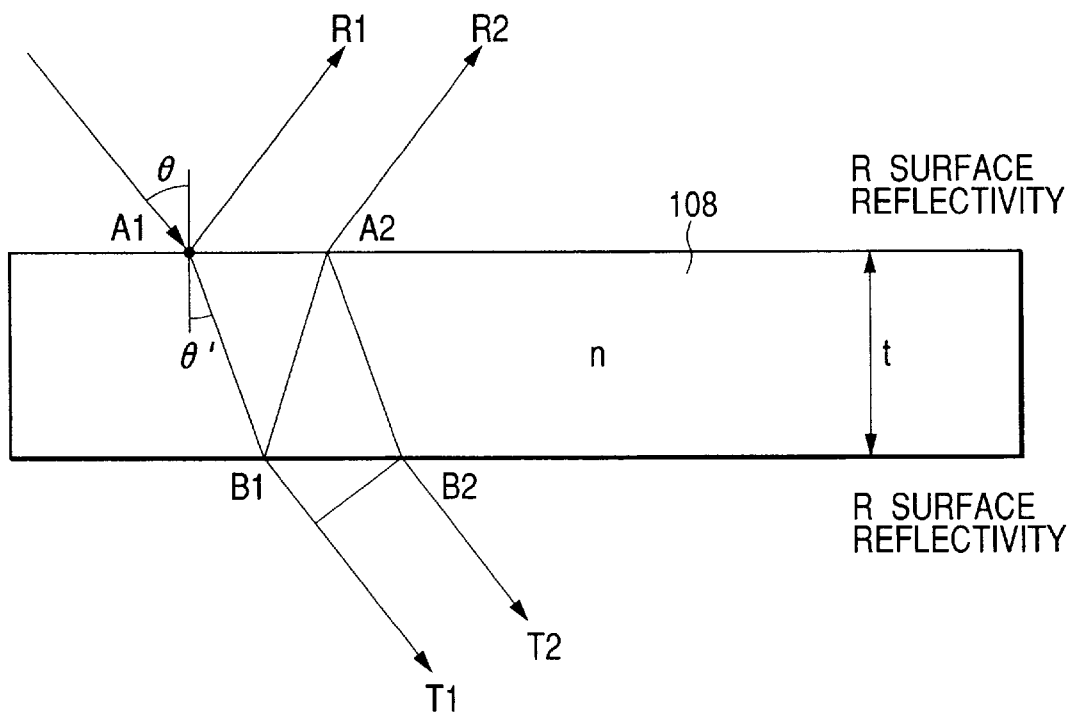
FIG. 3 is a diagram showing a principle of operation of an etalon according to the present invention.

As shown schematically in FIG. 3, the light incident on the etalon having a refractive index n at the point A1 is divided here into reflected light R1 and light which enters the etalon. The entered light is further divided into light reflected at the point B1 and light T1 transmitted to the outside of the etalon. Reflected light generated at the point BE includes light which will be emitted to the outside of the etalon through the opposite surface thereof as light R2 and light that is further reflected and emitted to the outside thereof as light T2. Thus, reflections are repeated inside the etalon to produce multiple reflections.

FIG. 3 illustrates how to measure several quantities in the equations described above. As shown in FIG. 3, R denotes the surface reflectivity of either surface of the etalon 108, n denotes the refractive index of the etalon, t denotes the thickness of the etalon, λ denotes the wavelength of light, and θ denotes an angle of light rays to the normal inside the etalon.

Here, Snell's law applies:

$$\sin\theta = n\sin\theta' \qquad (4)$$

In addition, the spacing of the multiple peaks in the transmitted light is called the free spectral range (FSR) which is expressed in the wavelength range by $$FSR = \lambda^2/2nt \qquad (5)$$

and in the frequency range by $$FSR = c/2nt \qquad (6),$$

where c denotes the speed of light. Therefore, if the etalon is optimally designed with the thickness t, the refractive index n, and the surface reflectivity R, the FSR can be made to agree with the ITU-T grid spacing. Setting the FSR to the ITU-T grid makes it possible to achieve wavelength deviation detection with steep wavelength selectivity over a wide range of wavelengths. Thus, it is possible for a plurality of transmission ranges of light which exist with a predetermined wavelength spacing to exist, and in which one of the transmission ranges is matched to a desired wavelength of the above-mentioned laser source.

Figure 4:
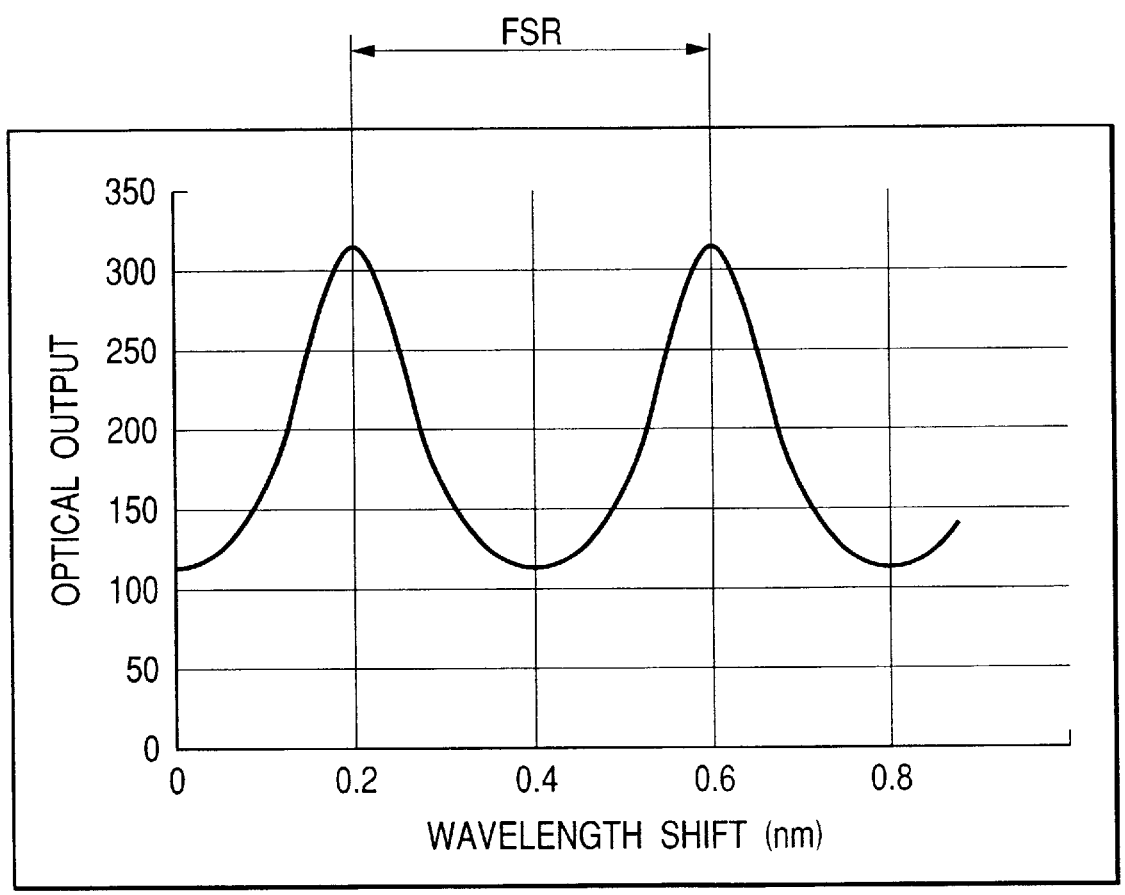
FIG. 4 is a graph showing a wavelength spectral characteristic of the etalon according to the present invention.

FIG. 4 is a graph showing an example of the wavelength spectral characteristic of the etalon. In the figure, the horizontal axis represents the wavelength shift and the vertical axis represents the optical output. The transmission peaks in the etalon appear repetitively with increasing/decreasing wavelength, as shown in FIG. 4. Further, the spacing of the transmission peaks is called, as mentioned above, the free spectral range (FSR) and is expressed by the equations (5), (6). Thus, transmitted light of the etalon so obtained is received by the photo detector 109 in FIG. 1 and is converted into a photoelectric current. On the other hand, the reflected light from the beam splitter 106 is received by the photo detector 110 and is also converted into a photoelectric current.

Then, the difference between photocurrent Pm generated by the photo detector 110 for optical output monitoring, as described above, and the photo current Pt generated in the photo detector 109 for wavelength monitoring, which is in obedience to the equation (1), as a result of the effect of the etalon 108, is-assumed as the deviation signal A(λ).

$$A(\lambda) = Pt - Pm \qquad (7)$$

It is also appropriate that, for the deviation signal, a signal normalized by the light quantity may be used.

$$A(\lambda) = (Pt - Pm)/(Pt + Pm) \qquad (8)$$

Thus, the wavelength deviation signal value A(λ), which was obtained with a high sensitivity, is fed back to the driving circuit 402 to control the temperature control element 401 of the laser diode 100 so as to become zero or a constant value. It should be noted here that, in order for the deviation signal represented by either equation (7) or (8) to cause the wavelength to capture one of the ITU-T grid wavelengths or its vicinity. The temperature of the laser diode is sensed from the value of the thermistor 403 beforehand, and the operating temperature is set to a temperature to said wavelength or its vicinity in accordance with the relation between the wavelength and the temperature obtained as shown in FIG. 2. After this preparation, the switch 405 in FIG. 1 is switched to the wavelength-locking loop. On the other hand, APC (AUTOMATIC POWER CONTROL) for keeping the power output of the laser diode constant compares, in a similar way, the output of the photo detector 110 with a set value and the difference thereof is fed back to the driving current control circuit 404 of the laser diode 100. The foregoing description concerns the control loop for wavelength locking.

A ratio of the full width of the half maximum t of the transmission peak of the etalon to FSR is called finesse Φ, which has the following relations of equations (9)–(11).

$$F = 4R \cdot (1-R)z \qquad (9)$$

$$\Phi = (n\sqrt{F})/2 \qquad (10)$$

$$\Phi = FSR/\epsilon \qquad (11)$$

Therefore, in order to achieve a steep spectral characteristic ε of the etalon, it is necessary to increase the reflectivities of both sides of the etalon and also to cause reflection at both sides to occur a number of times. Consequently, the angle of the incident light to the etalon needs to be set to the vertical angle (incident angle of zero degree) or its vicinity. If the incident angle deviates from the normal incidence, effective finesse decreases because the reflected light at each reflection constituting part of the multiple reflections is shifted in a direction perpendicular to the-optical axis and the wavefronts of the respective reflections superpose only partially, hence reducing the interference of light.

However, if the incident angle of light to the etalon becomes close to the normal incidence light resonates between a rear facet of the laser diode 100 and the etalon. This resonator can be analyzed by applying a method similar to that of the etalon that is a key component of the above-mentioned wavelength locker. Here, setting the reflectivity of the facet of the laser diode at 0.9, the transmissivity of the collimator lens at 0.95, the transmissivity of the beam splitter at 0.50, and also denoting the reflectivity of the etalon as $Ir(\lambda)$, the effective reflectivity that governs the finesse of a newly formed Fabry-Perot resonator is given by $$Re\text{-}SQRT(0.9 \times 0.95 \times 0.5 \times Ir(A)) \tag{12}$$

$$Ir(\lambda) = 1 - It \tag{13}$$

The finesse of the external Fabry-Perot resonator is given by putting Re in the equation (9) and (10). For example, if it is assumed that $Ir(\lambda)=0.5$, then Re=0.546, which indicates the existence of a resonator with a finesse of approximately 4. Therefore, as the wavelength varies ringing occurs in the output of the photo detector 110. Since this phenomenon induces a malfunction both in the APC (AUTOMATIC POWER CONTROL) of the laser diode and in the control loop for wavelength-locking, a countermeasure needs to be devised. This is a problem solved by the present invention.

Figure 5:
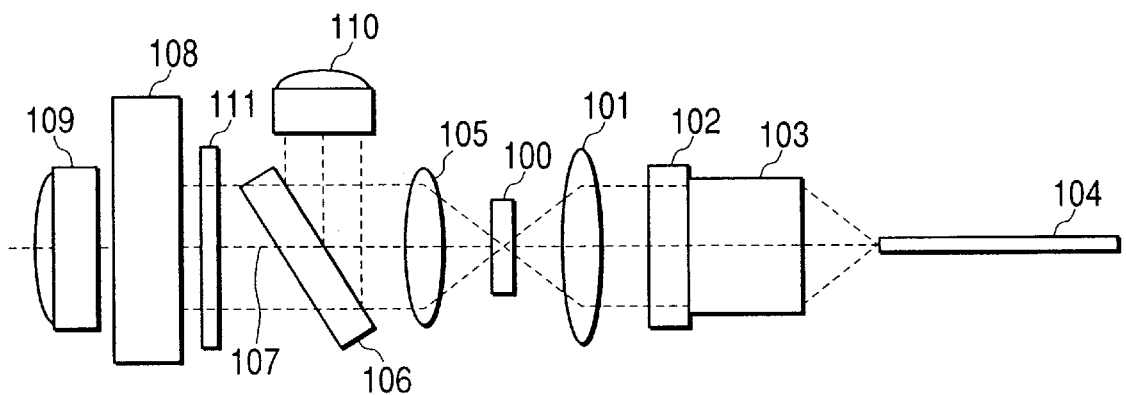
FIG. 5 is a diagram showing an example of a wavelength locking optical system according to the present invention.

A first method of the countermeasure includes reduction in the reflectivity of the facet of the laser diode and blocking the returned light onto the facet of the laser diode. Or, the direction of polarization of the returned light onto the facet of the laser diode is made orthogonal to that of the initial light to effect suppression of mutual interference. That is, a quarter-wave plate 111 is arranged between the collimator lens 105 and the etalon 108, as shown in FIG. 5. The physical relationship of the quarter-wave plate 111 and the beam splitter 106 is such as to be advantageous optically or in implementation.

FIG. 5 is a view showing an example of the wavelength locking optical system according to the present invention. This example uses the quarter-wave plate. A detailed explanation of the example shown in FIG. 5 is omitted because the basic configuration, other than the use of the quarter-wave plate, is the same as the example of FIG.

For a material of the quarter-wave plate 111, normally, quartz, calcite, etc., all of which have optical anisotropy, can be used. Since normally the light of the laser diode is almost linearly polarized in the direction of a waveguide stripe thereof (in a direction parallel to the face of the drawing), the light is given a circular polarization after passing through the wave plate 111; and, after being reflected by the etalon 108, it passes through the wave plate 111 again backwards, and it becomes linearly-polarized light whose direction of polarization is vertical to the face of the drawing. Since these mutually orthogonal linearly polarized light beams do not interfere with each other, occurrence of ringing, which becomes a problem, is reduced. However, light that has returned to the laser diode again and is reflected there again becomes linearly-polarized light whose direction of polarization is the same as that of the initial light produced by the transmission through the wave plate 111 and the reflection at the etalon 108. In this particular case, if the loss of the resonator is sufficiently large, mutual interference is minute and the ringing can be ignored, but the existence of such an expedient case depends on the degree of the loss of the resonator in comparison with an allowed value.

Figure 6:
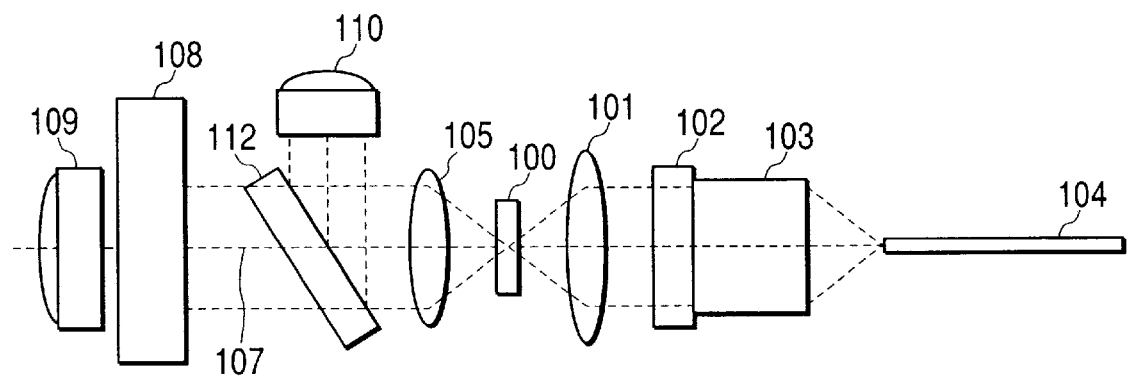
FIG. 6 is a diagram showing an example of the wavelength locking optical system according to the present invention.

FIG. 6 shows an embodiment where the above-mentioned wave plate 111 also serves as the beam splitter 106 functionally. Actually, a member 112 in FIG. 6 constitutes the member that serves basically as the quarter-wave plate and doubles also as the beam splitter. Regarding the example of FIG. 6, a detailed explanation is omitted because the basic configuration, other than that of the member 112, is the same as the example of FIG. 1 or FIG. 5. That is, the normal beam splitter 106 is made of a vitreous material and hence is optically isotropic. However, as in this example, the beam splitter can be provided with the function of a quarter wave plate for light of oblique incidence if the beam splitter is made of an anisotropic material and the thickness thereof is designed to be equivalent to that of the quarter-wave plate. Then, by designing a coating film on the surface, a beam splitter with a desired splitting ratio can be obtained. If such a component is provided, the number of the components can be reduced and an effect that improves the degree of integration in a package can be brought out.

Figure 7:
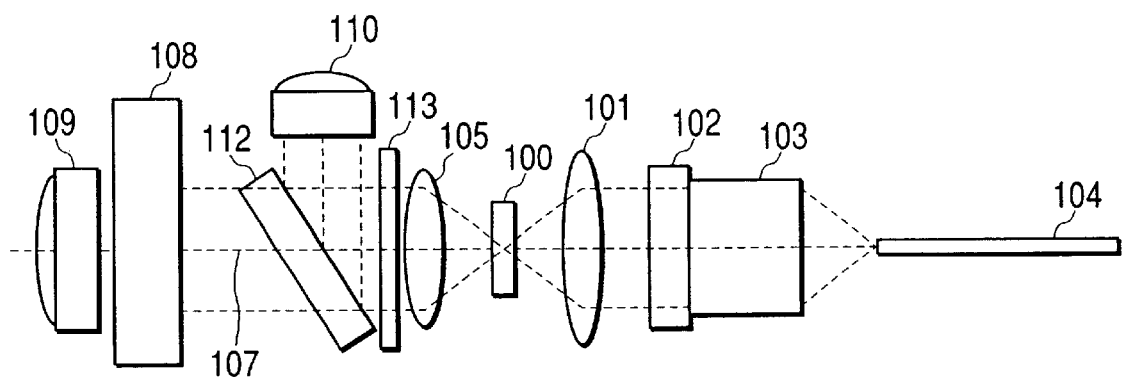
FIG. 7 is a diagram showing an example of the wavelength locking optical system according to the present invention.

FIG. 7 illustrates a further embodiment according to the present invention. That is, the embodiment has a base configuration as shown in FIG. 5 and FIG. 6 with the addition of a polarizer 113. The polarizer 113 is arranged between the collimator lens 105 and the quarter-wave plate 111, or the quarter-wave plate 112 also serving as a beam splitter, with its direction set such that linearly-polarized light of the laser diode can be transmitted. The linearly-polarized light having passed through the polarizer 113 passes through the quarter-wave plate, is reflected by the etalon, and again passes through the quarter-wave plate backwards to become linearly-polarized light whose direction of polarization is orthogonal to that of the initial light (in a direction vertical to the face of the drawing). Since the linearly polarized light having a direction of polarization vertical to the face of the drawing is blocked by the polarizer 113, it does not go back to the facet of the laser diode. Thus, the above-mentioned resonance is suppressed and the ringing in the output of the photo detector associated with the variation in the wavelength is reduced.

Figure 8:
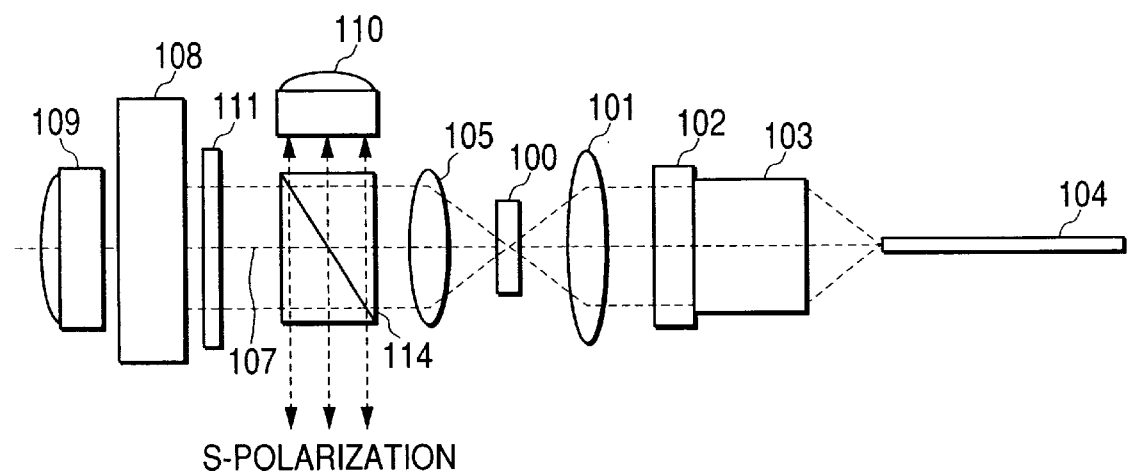
FIG. 8 is a diagram showing an example of the wavelength locking optical system according to the present invention.

FIG. 8 illustrates other means for similarly separating the returned light and the initial light through the use of polarization. That is, it is an embodiment wherein the beam splitter doubles as a polarizer. The linearly polarized light from the laser diode is made to enter a beam splitter 114, as P (parallel) light, which transmits part of the light and reflects part of the light. This reflected light is received by the photo detector 110 and serves as part of the output monitor/wavelength deviation detection signal. The transmitted light passes through the quarter-wave plate 111 to become circularly-polarized light, is reflected by the etalon 108, again passes through the quarter-wave plate 111 so as to have an s (i.e., senkrecht) polarization, and enters the polarizing beam splitter 114. In this example, the light is reflected there by a reflectivity of almost 100 percent, and thus the light returned to the laser diode is blocked. Needless to say, the transmitted light from the etalon 108 arrives at the photo detector 109 to produce the wavelength deviation signal. Such an optical arrangement makes it possible to suppress the resonance occurring between the facet of the laser diode and the etalon, and also to close a stable wavelength control loop because malfunction in the wavelength deviation signal as well as in the optical output monitor are eliminated.

Figure 9:
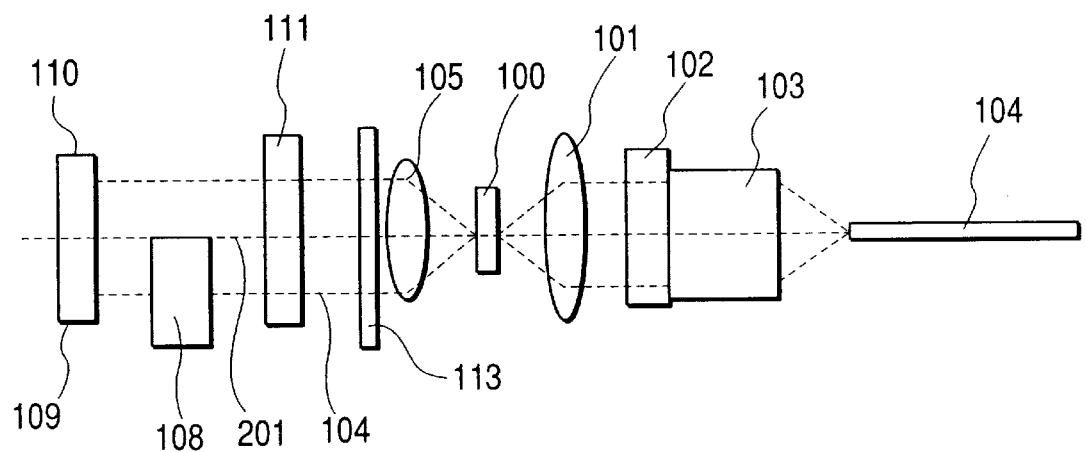
FIG. 9 is a diagram showing an example of the wavelength locking optical system according to the present invention.

FIG. 9 illustrates a further embodiment according to the present invention. In this example, another structure as the wavelength locking optical system is adopted. That is, a collimated light beam of the laser diode 100 is spatially divided into two portions of light whose boundary is an optical axis 201, one of the two portions, as it is, being made to arrive at the photo detector 110 to produce the optical output monitor signal. The other of the two portions passes through the etalon 108 to arrive at the photo detector 109 to produce the wavelength deviation detection signal. Similarly, in this optical system, a resonator is formed between the facet of the laser diode and the etalon 108, and the same problem as that described above may occur. To devise a countermeasure against the problem, the suppression of the resonance similar to that described above is performed with a combination of the polarizer 113 and the wave plate 111, both of which are arranged in the optical path. The photo detectors 109 and 110 can be monolithically fabricated, and that, with the width of an isolation region ranging from a few μm to a few tens of μm.

Figure 10:
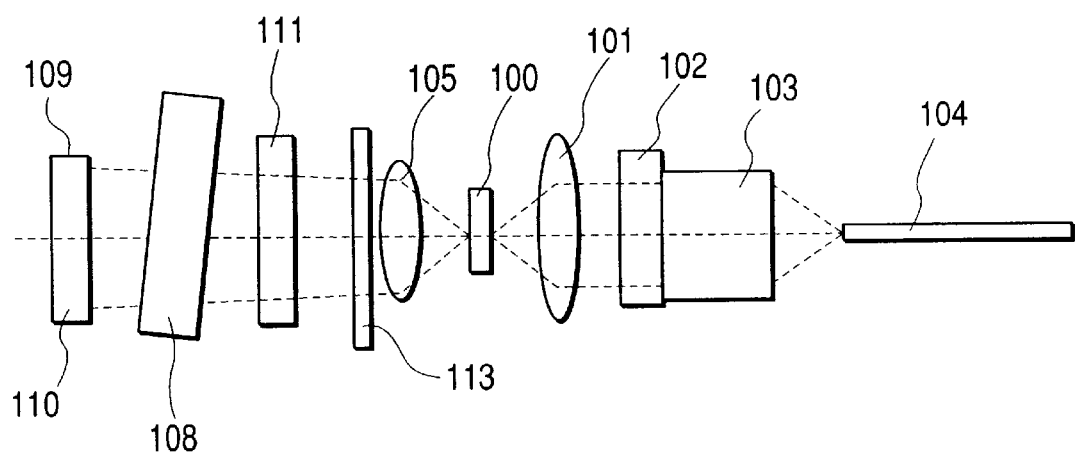
FIG. 10 is a diagram showing an example of the wavelength locking optical system according to the present invention.

FIG. 10 illustrates another embodiment according to the present invention. This example is one that uses a slightly-tilted etalon.

In this example, a collimated light beam from the laser diode 100 is made to enter the etalon 108 after being diverged or converged to a certain degree. The photo detectors arranged just after the slightly-tilted etalon 108 are split photo detectors as described with reference to FIG. 9. The spectral characteristics of two light beams each passing through two parts of the slightly-tilted etalon 108 that correspond to split photo detecting areas of the split photo detectors are much the same curve as depicted in FIG. 4, but are different in phase (wavelength shift) relative to each other, and the subtraction of both characteristics produces the wavelength deviation detection signal. Also, in this wavelength locking optical system, resonance may occur between the etalon 108 and the facet of the laser diode, and hence, a countermeasure against the resonance needs to be devised. For this purpose, this example performs polarization separation using a combination of the quarter-wave plate 111 and the polarizer 113, or only with the quarter-wave plate, to suppress the resonance. In this case, the optical output monitor signal of the laser diode can be a sum of the signals of the photo detectors 110 and 109.

Figure 11:
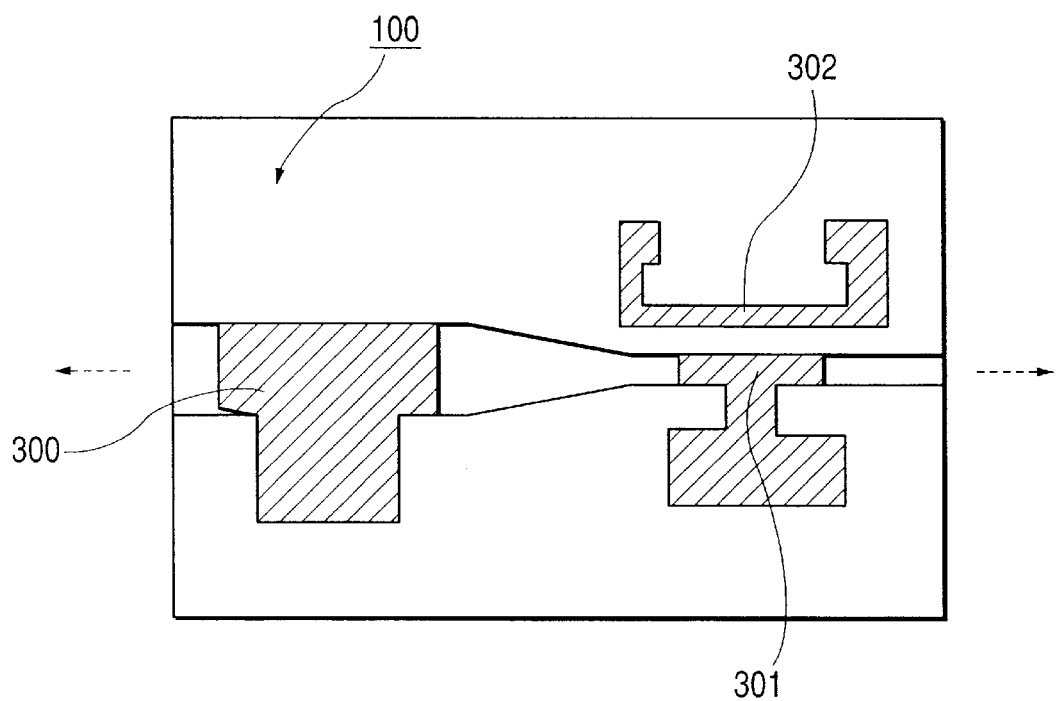
FIG. 11 is a sectional view showing an example of a wavelength locked optical module according to the present invention.

FIG. 11 is a plan view of an example of the laser diode light source 100 that is used in accordance with the present invention. In this example, a DFB type laser diode 300 and an electro absorbing modulator 301 are monolithically integrated. As shown in FIG. 1, the entire light source is mounted on a temperature controlling device, such as the Peltier device, and hence, the wavelength thereof can be tuned to a desired wavelength by using the relation between the wavelength and the temperature, as shown in FIG. 2. Note that, in tuning the wavelength, the temperature of the electro absorbing modulator 301 also changes; accordingly, it is not likely that the characteristic of the modulator 301 is assured. Therefore, the present invention adopts a contrivance where a thin film heater 302 is formed adjacent to the optical modulator 301 to control the operating temperature of the optical modulator 301 always at an optimal value.

Figure 12:
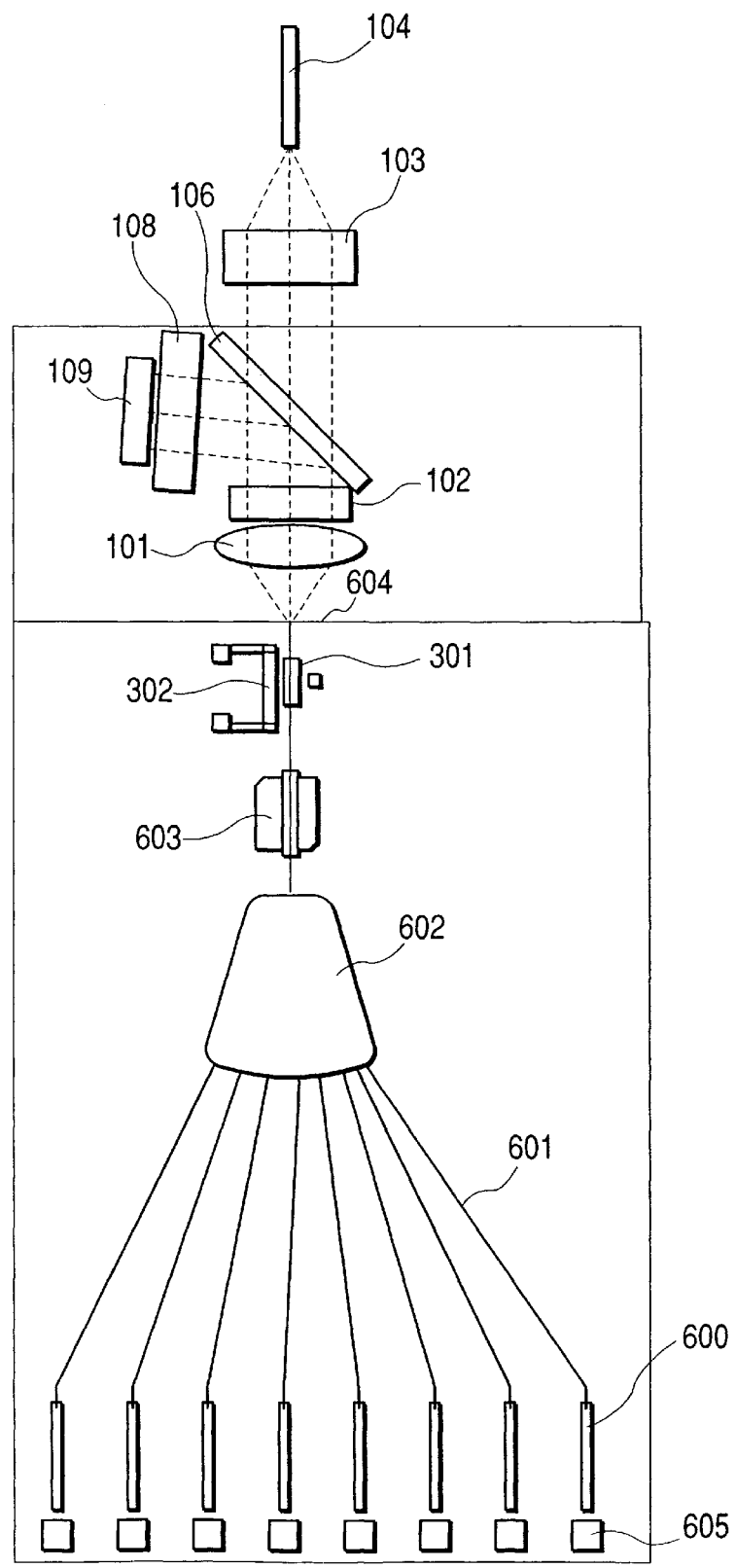
FIG. 12 is a diagram showing an example of a wavelength locked optical module, wherein tunable laser diodes, whose wavelengths are locked by the wavelength locking optical system according to the present invention, are arranged side by side to achieve enlargement of a tunable wavelength range.

FIG. 12 illustrates another embodiment of the present invention. This example uses a laser diode device in which a plurality of laser parts are integrated.

That is, DFB lasers 600 are integrated in the form of an array, optical outputs of the respective lasers are multiplexed into a single waveguide by a multiplexer 602 after passing through waveguides 601, and the optical outputs are restored to a desired optical output by a semiconductor amplifier 603, regaining losses of the optical outputs hitherto being experienced. Then, this light arrives at an exit facet 604 through the electro absorbing modulator 301 equipped with the thin film heater 302. Subsequently, the light becomes a divergent light beam, is focused by the collimator lens 101, passes through the optical isolator 102, is transmitted through the beam splitter 106, and is focused onto the optical fiber 104 by the converging lens 103 so as to travel therein for information transmission. Reflected light from the beam splitter 106 arrives at the photo detector 109 via the etalon or the dielectric multi-layer filter 108. Here, a point that differentiates the present invention from the conventional configuration is that the optical isolator 102 is arranged between the beam splitter 106 and the collimator lens 105. With such a configuration, the returned light from the etalon 108 by reflection is blocked by the optical isolator 102 and no resonator is formed externally; therefore, no ringing occurs at the photo detector 109. On the other hand, just behind the DFB lasers, waveguide photo detectors 605 are provided, which are used for monitoring the respective outputs of the DFB lasers.

Figure 13:
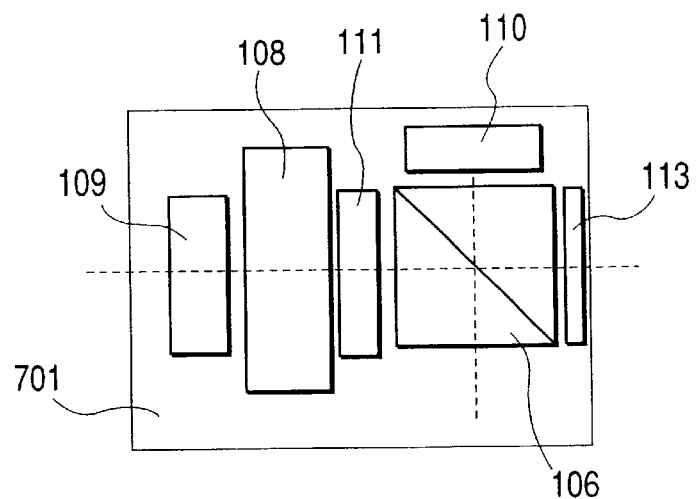
FIG. 13 is a diagram showing a sub-assembly to be used in the optical communication module.
Figure 14:
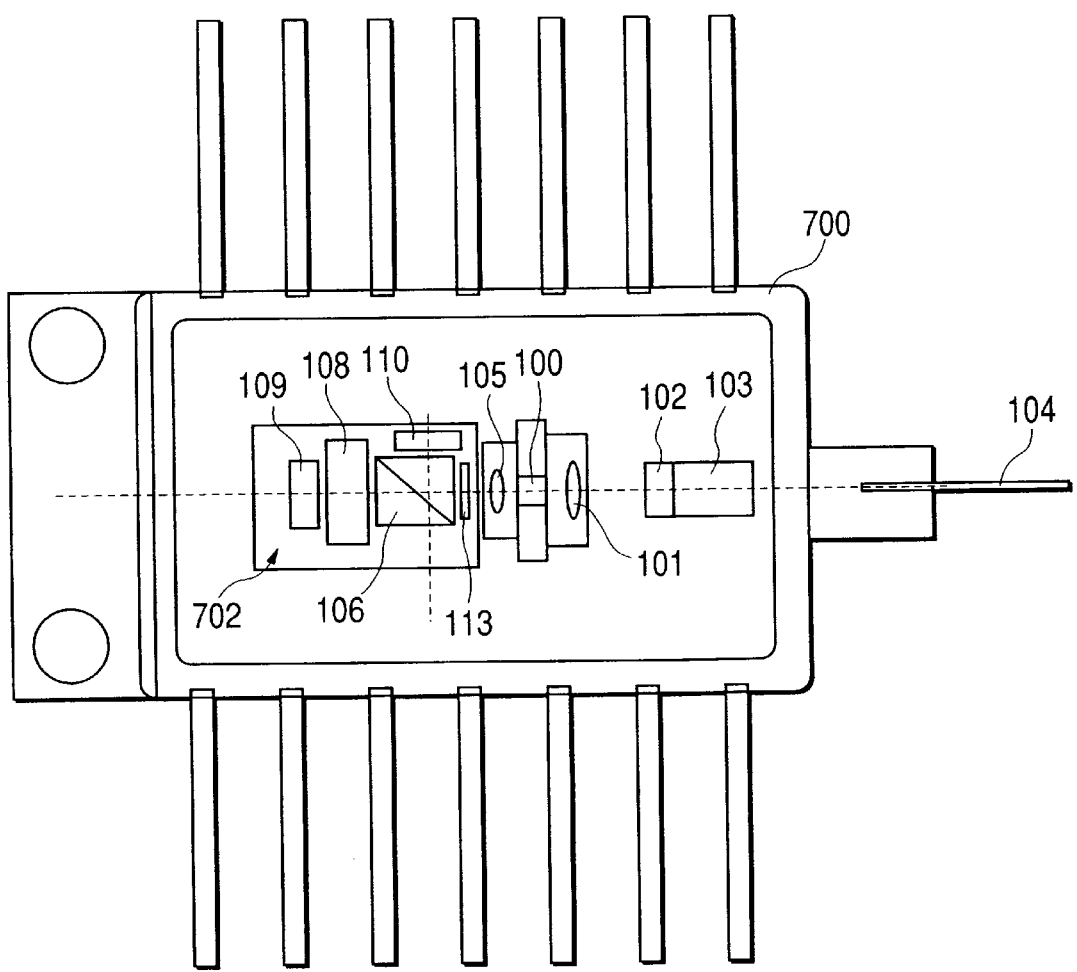
FIG. 14 is a diagram showing an example of the optical communication module into which a wavelength locking unit according to the present invention is built.

FIG. 14 is a view showing an example of a communication module package according to the present invention. FIG. 13 is a plan view showing an example of the sub-assembly that is to be used therefor. That is, this sub-assembly is such that the wavelength locking optical system according to the present invention is loaded in a communication module package 700 of a butterfly type with 14 pins. The etalon 108, the wave plate 111, the beam splitter 106, the polarizer 113, and the photo detectors 109, 110 are mounted on a substrate 702, which is arranged on an optical path of the collimated light optical system of the laser diode that is operated at a different site and is lasing at the desired wavelength, and the incident angle of light to the etalon is adjusted and fixed to complete the sub-assembly. Following this, a sub-assembly 701 is loaded in the optical path of the collimated optical system for a desired wavelength that has been produced in the package 700. This method introduces an advantage of packaging that was made possible through the use of the collimated plane wave in accordance with the present invention.

Making the wavelength locking part in the sub-assembly is hard to achieve by a method for wavelength-locking described in the above-mentioned JP-A-79723/1998. The reason for this is that, in order to adjust the angle of the divergent light beam which is to enter into the etalon, the gap between the laser diode and the collimator lens needs to be fine tuned, and the angle of the tilted etalon needs to be fine tuned while monitoring the outputs from paired photo detectors. Consequently, it is necessary to carry out adjustment in a narrow, work-in-process module. The embodiment of the wavelength locking optical system described above uses the etalon as a wavelength deviation detection filter by way of example, but instead of the etalon, a dielectric multi-layer filter can be used. In this case, polarization controlling elements are employed to suppress the resonance between the dielectric filter and the facet of the laser diode.

As described above in detail, adoption of the configuration composed of basic elements according to the present invention as a solution makes it possible to close a control loop for wavelength-locking that is stable optically and electrically and hence to achieve the full performance of the etalon. That is, the present invention achieves resolution of a technical problem that hitherto was impossible to solve, in terms of resolution of wavelength selection, utilization of light, an increase in the density of packaging inside the laser source module, mechanical stability, correction of shift in locked wavelength due to the temperature change, etc. Further, with the utilization of the wavelength-controlling scheme according to the present invention, it becomes possible not only to lock the lasing wavelength of a laser diode, but also to shift and then lock the wavelength thereof to any of the ITU-T grids. Therefore, according to the present invention, a laser source indispensable for a wavelength division multiplexing optical communication apparatus and a router device of wavelength channels can be provided.

Hereafter, main forms by which the present invention is carried out in practice will be enumerated.

A first form of the present invention includes, in an optical module wherein a divergent light beam, which is guided directly or indirectly from the rear or the front of a laser source or a light source in which the tunable laser source and a modulator are integrated, is focused with a lens, and a wavelength filter is arranged in an optical path of the focused light beam, there is provided optical path dividing means for dividing transmitted light or reflected light of the wavelength filter, and there is provided means that guides the divided light beams to a plurality of photo detectors, detects an amount of the lasing wavelength shift of the laser source in accordance with the difference of photo currents flowing in the respective photo detectors, and controls the wavelength of the laser source so that the difference of the photo currents is kept at a constant value. A laser diode module and an application device in which the laser diode module is employed are characterized in that the laser diode device has means for reducing mutual superposition between an initial light beam and a reflected light beam generated by a reflecting substance existing in the light source and/or the optical path of the focused light beam in terms of physical overlapping, or reducing the mutual superposition in terms of the polarization state.

A second form of the present invention includes, in an optical module wherein a divergent light beam, which is guided directly or indirectly from the rear or the front of a laser source or a light source in which the tunable laser source and a modulator are integrated, is focused with a lens, and a wavelength filter is arranged in an optical path of the focused light beam, there is provided optical path dividing means for dividing transmitted light or reflected light of the wavelength filter, and there is provided means that guides the divided light beams to a plurality of photo detectors, detects a quantity of the lasing wavelength shift of the laser source in accordance with the difference of photo currents flowing in the respective photo detectors, and controls the wavelength of the laser source so that the difference of the photo currents is kept at a constant value. A laser diode module and an application device in which the laser diode module is employed according to the above-mentioned first form are characterized in that a wave plate is arranged in the optical path of the focused light beam.

A third form of the present invention includes, in an optical module wherein a divergent light beam, which is guided directly or indirectly from the rear or the front of a laser source or a light source in which the tunable laser source and a modulator are integrated, is focused with a lens, and a wavelength filter is arranged in an optical path of the focused light beam, there is provided optical path dividing means for dividing transmitted light or reflected light of the wavelength filter, and there is provided means that guides the divided light beams to a plurality of photo detectors, detects a quantity of the lasing wavelength shift of the laser source in accordance with the difference of photo currents flowing in the respective photo detectors, and controls the wavelength of the laser source so that the difference of the photo currents is kept at a constant value. A laser diode module and an application device in which the laser diode module is employed according to the above-mentioned first form are characterized in that a wave plate and a polarizer are arranged in the optical path of the focused light beam.

A fourth form of the present invention includes, in an optical module wherein a divergent light beam, which is guided directly or indirectly from the rear or the front of a laser source or a light source in which the tunable laser source and a modulator are integrated, is focused with a lens, and a wavelength filter is arranged in an optical path of the focused light beam, there is provided optical path dividing means for dividing transmitted light or reflected light of the wavelength filter, and there is provided means that guides the divided light beams to a plurality of photo detectors, detects a quantity of the lasing wavelength shift of the laser source in accordance with the difference of photo currents flowing in the respective photo detectors, and controls the wavelength of the laser source so that the difference of the photo currents is kept at a constant value. A laser diode module and an application device in which the laser diode module is employed according to the above-mentioned first form are characterized in that the wave plate arranged in the optical path of the focused light beam doubles as light beam dividing means.

A fifth form of the present invention includes, in an optical module, wherein a divergent light beam, which is guided directly or indirectly from the rear or the front of a laser source or a light source in which the tunable laser source and a modulator are integrated is focused with a lens, and a wavelength filter is arranged in an optical path of the focused light beam, there is provided optical path dividing means for dividing transmitted light or reflected light of the wavelength filter, and there is provided means that guides the divided light beams to a plurality of photo detectors, detects -a quantity of the lasing wavelength shift of the laser source in accordance with the difference of photo currents flowing in the respective photo detectors, and controls the wavelength of the laser source so that the difference of the photo currents equals a constant value. A laser diode module and an application device in which the laser diode module is employed according to the above-mentioned first form are characterized in that a wave plate and a polarizing beam splitter are arranged in the optical path of the focused light beam.

A sixth form of the present invention includes, in an optical module wherein a divergent light beam, which is-guided directly or indirectly from the rear or the front of a laser source or a light source in which the tunable laser source and a modulator are integrated, is focused with a lens, and a wavelength filter is arranged in an optical path of the focused light beam, there is provided optical path dividing means for dividing transmitted light or reflected light of the wavelength filter, and there is provided means that guides the divided light beams to a plurality of photo detectors, detects a quantity of the lasing wavelength shift of the laser source in accordance with the difference of photo currents flowing in the respective photo detectors, and controls the wavelength of the laser source so that the difference of the photo currents is kept at a constant value. A laser diode module and an application device in which the laser diode module is employed according to the above-mentioned first form are characterized in that an optical isolator consisting of a polarizer and a Faraday rotator is employed.

A seventh form of the present invention includes, in an optical module wherein a divergent light beam, which is guided directly or indirectly from the rear or the front of a laser source or a light source in which the tunable laser source and a modulator are integrated, is focused with a lens, and a wavelength filter is arranged in an optical path of the focused light beam, there is provided optical path dividing means for dividing transmitted light or reflected light of the wavelength filter, there is provided means that guides the divided light beams to a plurality of photo detectors, detects a quantity of the lasing wavelength shift of the laser source in accordance with the difference of photo currents flowing in the respective photo detectors, and controls the wavelength of the laser source so that the difference of the photo currents equals a constant value. The is also provided means that reduces mutual superposition between the initial light beam and a reflected light beam generated by a reflecting substance existing in the light source and/or the optical path of the focused light beam in terms of physical overlapping or mutual superposition described above in terms of polarization state. A laser diode module and an application device in which the laser diode module is employed are characterized in that the wavelength filter is a Fabry-Perot etalon.

An eighth form of the present invention includes, in an optical module wherein a divergent light beam, which is guided directly or indirectly from the rear or the front of a laser source or a light source in which the tunable laser source and a modulator are integrated, is focused with a lens, and a wavelength filter is arranged in an optical path of the focused light beam, there is provided optical path dividing means for dividing transmitted light or reflected light of the wavelength filter, there is provided means that guides the divided light beams to a plurality of photo detectors, detects a quantity of the lasing wavelength shift of the laser source in accordance with the difference of photo currents flowing in the respective photo detectors, and controls the wavelength of the laser source so that the difference of the photo currents equals a constant value. There is also provided means that reduces mutual superposition between the initial light beam and a reflected light beam generated by a reflecting substance existing in the light source and/or the optical path of the focused light beam in terms of physical overlapping or mutual superposition described above in terms of polarization state. A laser diode module and an application device in which the laser diode module is employed, characterized in that the wavelength filter is a dielectric multi-layer filter.

A ninth form of the present invention includes a laser diode module and an application device in which the laser diode module is employed according to the above-mentioned first form, characterized in that a plurality of laser sources each having the laser wavelength controlling means are arranged side by side and there is provided means that combines tunable wavelength ranges covered by respective laser sources.

A tenth form of the present invention includes a laser diode module and an application device in which the laser diode module is employed according to the above-mentioned first form, characterized in that part of or all of the laser wavelength controlling means is built into a package of the laser source module.

An eleventh form of the present invention includes a laser diode module and an application device in which the laser diode module is employed, comprising at least: a laser diode device; a first photo detector part for receiving, directly or indirectly, first divided light that is a first portion of light when at least one of light emissions of the laser diode device is divided into two portions of light, each traveling a different optical path; a second photo detector for receiving said second divided light that is a second portion of light thus divided via at least a wavelength selective member; and means for controlling the lasing wavelength of the laser diode device on the basis of outputs of the above-mentioned first and second photo detector parts, and characterized in that superposition between a beam of the light emission from the above-mentioned laser diode device and a beam of the reflected light from a reflecting substance in the optical path between the above-mentioned laser diode device and the above-mentioned wavelength selective member is smaller than superposition of the beams at a parallel reflection plane.

According to the present invention, stabilization of the wavelength of the laser diode, namely, stabilization of a wavelength locking optical system in the laser diode module comprising the wavelength locking optical system can be achieved.

Further, according to the present invention, external feedback noise in the laser diode can be eliminated or alleviated.

What is claimed is:

1. A laser diode module comprising:
    a laser diode device;
    a first photo detector part for receiving, directly or indirectly, first divided light that is a first portion of light when at least one of light emissions of said laser diode device is divided into two portions of light each traveling a different optical path;
    a second photo detector part for receiving second divided light that is a second portion of light thus divided via at least a wavelength selective member; and
    means for controlling the lasing wavelength of said laser diode device on the basis of outputs of said first and second photo detector parts,
    wherein at least one of a quarter-wave plate and a polarizer is provided in an optical path between said laser diode device and said wavelength selective member.

2. A laser diode module, comprising:
    a laser diode device;
    a first photo detector part for receiving, directly or indirectly, first divided light that is a first portion of light when at least one of light emissions of said laser diode device is divided into two portions of light each traveling a different optical path;
    a second photo detector part for receiving second divided light that is a second portion of light thus divided via at least a wavelength selective member; and
    means for controlling the lasing wavelength of said laser diode device on the basis of outputs of said first and second photo detector parts,
    wherein a structure that generates reflected light having a degree of polarization different from that of incident light falling on said wavelength selective member is provided in an optical path between said laser diode device and said wavelength selective member.

3. A laser diode module, according to claim 2, wherein said structure provided in the optical path enables directions of polarization of the incident light falling on said wavelength selective member and of the reflected light to be orthogonal to each other.

4. A laser diode module, comprising:
    a laser diode device;
    a first photo detector part for receiving, directly or indirectly, first divided light that is a first portion of light when at least one of light emissions of said laser diode device is divided into two portions of light each traveling a different optical path;
    a second photo detector part for receiving second divided light that is a second portion of light thus divided via at least a wavelength selective member; and
    means for controlling the lasing wavelength of said laser diode device on the basis of outputs of said first and second photo detector parts,
    wherein a quarter-wave plate is provided in an optical path between said laser diode device and said wavelength selective member.

5. A laser diode module according to claim 4, further comprising a polarizer provided in the optical path between said laser diode device and said wavelength selective member.

6. A laser diode module according to claim 4, wherein said quarter-wave plate forms a portion of a member which enables division of at least one of light emissions of said laser diode device into two portions of light each traveling a different optical path.

7. A laser diode module according to claim 4, further comprising a polarizing beam splitter provided in the optical path between said laser diode device and said wavelength selective member.

8. A laser diode module according to claim 4, wherein there are provided a polarizer and an optical isolator in the optical path between said laser diode and said wavelength selective member.

9. A laser diode module according to claim 4, wherein said wavelength selective member is at least either of a Fabry-Perot etalon or a dielectric multi-layer filter.

10. A laser diode module according to claim 4, wherein said laser diode device has a plurality of light emission regions.

* * * * *